(12) United States Patent
Kurz et al.

(10) Patent No.: US 9,076,818 B2
(45) Date of Patent: Jul. 7, 2015

(54) SEMICONDUCTOR DEVICE FABRICATION METHODS

(75) Inventors: Andreas Kurz, Dresden (DE); Peter Javorka, Radeburg (DE); Sergej Mutas, Dresden (DE); Clemens Wündisch, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 141 days.

(21) Appl. No.: 13/528,257

(22) Filed: Jun. 20, 2012

(65) Prior Publication Data

US 2013/0344673 A1 Dec. 26, 2013

(51) Int. Cl.
| H01L 21/4763 | (2006.01) |
| H01L 29/66 | (2006.01) |
| H01L 29/78 | (2006.01) |
| H01L 21/8234 | (2006.01) |

(52) U.S. Cl.
CPC ........ *H01L 29/6659* (2013.01); *H01L 29/7833* (2013.01); *H01L 21/823418* (2013.01); *H01L 21/823443* (2013.01)

(58) Field of Classification Search
CPC ................. H01L 21/82345; H01L 21/823443; H01L 21/823418
USPC ................... 438/649, 683, 648; 257/E21.199
See application file for complete search history.

(56) References Cited

U.S. PATENT DOCUMENTS

| 6,020,242 | A | * | 2/2000 | Tsai et al. ..................... 438/279 |
| 6,214,709 | B1 | * | 4/2001 | Chen ............................. 438/586 |
| 6,277,683 | B1 | | 8/2001 | Pradeep et al. |
| 2002/0019090 | A1 | * | 2/2002 | Ogata ........................... 438/239 |
| 2002/0123192 | A1 | * | 9/2002 | Lee ................................ 438/240 |
| 2005/0227440 | A1 | * | 10/2005 | Ema et al. ..................... 438/275 |
| 2007/0040225 | A1 | * | 2/2007 | Yang ............................. 257/369 |
| 2007/0099407 | A1 | * | 5/2007 | Lu et al. ........................ 438/592 |
| 2007/0264811 | A1 | * | 11/2007 | Lee et al. ...................... 438/586 |
| 2008/0026529 | A1 | * | 1/2008 | White et al. .................. 438/275 |
| 2008/0124854 | A1 | * | 5/2008 | Choi et al. .................... 438/197 |
| 2008/0261394 | A1 | * | 10/2008 | Wang et al. ................... 438/664 |
| 2009/0026551 | A1 | * | 1/2009 | Nakagawa et al. ........... 257/374 |
| 2010/0237435 | A1 | * | 9/2010 | Chudzik et al. ............... 257/380 |

FOREIGN PATENT DOCUMENTS

JP 2000-031295 * 1/2000 .......... H01L 21/8238

* cited by examiner

*Primary Examiner* — Caridad Everhart
(74) *Attorney, Agent, or Firm* — Ingrassia Fisher & Lorenz, P.C.

(57) ABSTRACT

A method for fabricating a semiconductor device includes forming first and second gate structures overlying the semiconductor substrate, and depositing a layer of a silicide-resistant material over the first and second gate structures and over the semiconductor substrate. The method further includes forming sidewall spacers from the layer of silicide-resistant material adjacent the first gate structure and removing the silicide-resistant material adjacent the sidewall spacers to expose the silicon substrate in a source and drain region. Still further, the method includes implanting conductivity determining impurities in the source and drain region, depositing a silicide forming metal, and annealing the semiconductor device to form a silicide in the source and drain region. The silicide-resistant material is not removed from over the second gate structure so as to prevent silicide formation at the second gate structure.

20 Claims, 2 Drawing Sheets

SEMICONDUCTOR DEVICE FABRICATION METHODS

TECHNICAL FIELD

Embodiments of the subject matter disclosed herein generally relate to semiconductor device fabrication methods, and more particularly, embodiments of the subject matter disclosed herein relate to semiconductor device fabrication methods employing the contemporaneous formation of gate sidewall spacers and a silicide masking layer.

BACKGROUND

Transistors, such as metal oxide semiconductor field-effect transistors ("MOSFETs" or "MOS" transistor devices), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

The use of MOS transistor devices for logic as well as memory applications, as well as for passive devices such as resistors, electrostatic-sensitive (ESD) devices, and laterally diffused metal oxide semiconductor (LDMOS) devices, all fabricated on the same semiconductor chip, has resulted in increased process complexity as well as increased cost. The ability to share specific process steps, or sequences, used for each type, can significantly reduce process complexity and cost. For example, a self-aligned metal silicide ("salicide") layer is often used with the high performance logic devices, while the salicide layer is not desired for passive devices. A silicide masking layer, which can be made, for example, of silicon nitride, is sometimes used to block silicide formation in the area of the passive devices, where silicide is not desired.

The formation of a separate and dedicated silicide masking layer, along with its subsequent removal after silicidation is complete, adds multiple process steps to the semiconductor fabrication process, and consequently increases the cost thereof. Further, the removal of the silicide masking layer requires the deposition of a photoresist material and etching, which can damage the MOS transistor devices when performed multiple times, especially in small-scale architectures such as 28 nm architectures. As such, it would be desirable to provide semiconductor device fabrication methods that reduce the number of steps involved in the silicidation process. Furthermore, other desirable features and characteristics of the present invention will become apparent from the subsequent detailed description of the invention and the appended claims, taken in conjunction with the accompanying drawings and this background of the invention.

BRIEF SUMMARY

Semiconductor device fabrication methods are provided. In one embodiment, a method for fabricating a semiconductor device includes forming first and second gate structures overlying the semiconductor substrate, and depositing a layer of a silicide-resistant material over the first and second gate structures and over the semiconductor substrate. The method further includes forming sidewall spacers from the layer of silicide-resistant material adjacent the first gate structure and removing the silicide-resistant material adjacent the sidewall spacers to expose the silicon substrate in a source and drain region. Still further, the method includes implanting conductivity determining impurities in the source and drain region, depositing a silicide forming metal, and annealing the semiconductor device to form a silicide in the source and drain region. The silicide-resistant material is not removed from over the second gate structure so as to prevent silicide formation at the second gate structure.

In another embodiment, a method for fabricating a semiconductor device includes forming a plurality of gate structures overlying a semiconductor material substrate, conformally depositing a layer of silicon nitride over the first and second gate structures and over the semiconductor substrate, etching the layer of silicon nitride using RIE techniques to form sidewall spacers adjacent at least one of the plurality of gate structures, and etching the layer of silicon nitride using photo-lithographic etching techniques adjacent the sidewall spacers and over a source/drain region of the at least one of the plurality of gate structures. The method further includes depositing a silicide forming metal and annealing the semiconductor device to form a silicide in the source/drain region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, and wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The techniques and technologies described herein may be utilized to fabricate MOS transistor devices. Although the term "MOS transistor device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Furthermore, various steps in the fabrication of semiconductor devices are well known and so, in the interest of brevity, many conventional steps will only be mentioned briefly herein or will be omitted entirely without providing the well-known process details.

FIGS. 1-6 illustrate the fabrication process for an exemplary semiconductor device, or integrated circuit ("IC") 100, in accordance with an embodiment of the present disclosure. IC 100 can include a plurality of N-channel MOS (NMOS)

transistors and/or P-channel MOS (PMOS) transistors, and other circuitry components. However, for simplicity of illustration, only two transistors 104 and 106 are illustrated. Those of skill in the art will appreciate that IC 100 may include a large number of such transistors as required to implement a desired circuit function. In an exemplary embodiment, IC 100 is configured in a small-scale architecture, for example a 28 nm architecture. As will be discussed in greater detail below, transistor 104 is a device that will incorporate a metal silicide layer, whereas transistor 106 is a device, such as a passive device that will not incorporate a metal silicide layer. It will further be appreciated that numerous other gate configurations are possible for transistor 106, when embodied as a passive device. These include, for example, a poly-silicon gate without the high-k metal included. As such, the present disclosure is not limited to any particular form of gate structure, or to any particular MOS device in general.

Figure 1:
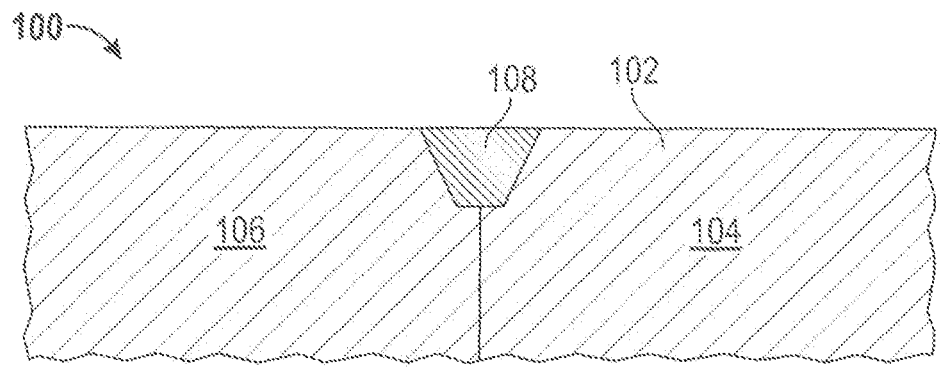
FIGS. 1-6 are cross-sectional views that illustrate a method for fabricating a semiconductor device in accordance with an exemplary embodiment.

The initial steps in the fabrication of IC 100 are conventional so the structure resulting from these steps is illustrated in FIG. 1, but the initial steps themselves are not shown. The IC 100 is fabricated on a silicon substrate 102, which can be either a bulk silicon wafer as illustrated or a thin silicon layer on an insulating substrate (SOI). As used herein, the terms "silicon layer" and "silicon substrate" will be used to encompass the relatively pure or lightly impurity-doped monocrystalline silicon materials typically used in the semiconductor industry as well as silicon admixed with other elements such as germanium, carbon, and the like to form substantially monocrystalline semiconductor material.

Transistors 104 and 106 are electrically isolated by a dielectric isolation region 108, preferably a shallow trench isolation (STI) region. As is well known, there are many processes that can be used to form the STI, so the process need not be described here in detail. In general, STI includes a shallow trench that is etched into the surface of the semiconductor substrate and that is subsequently filled with an insulating material. After the trench is filled with an insulating material such as silicon oxide, the surface is usually planarized, for example by chemical mechanical planarization (CMP).

At least a surface portion of the silicon substrate is lightly doped with conductivity determining impurities for the fabrication of transistors 104 and 106, such as P-type or N-type conductivity determining impurities (not explicitly illustrated). Impurity doping can include, for example, the implantation and subsequent thermal annealing of dopant ions such as boron or arsenic.

Figure 2:
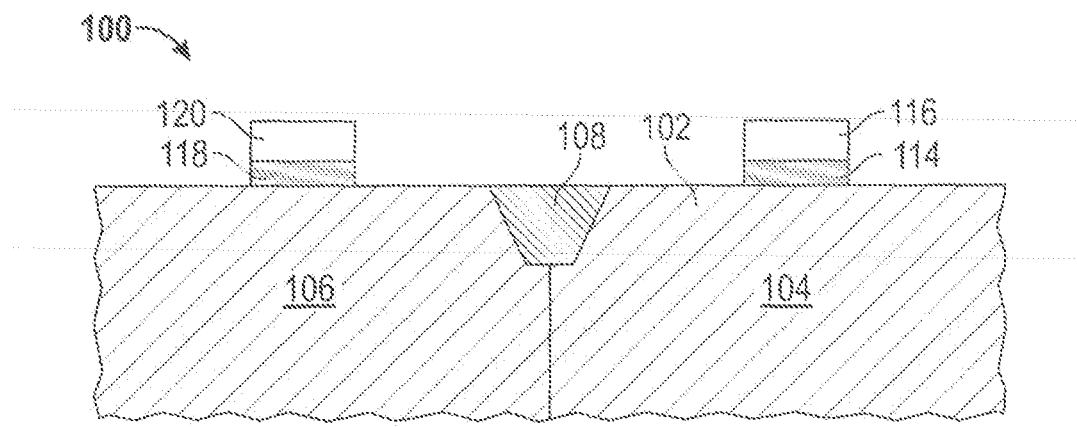

With reference now to FIG. 2, in conventional processing, layers of gate insulating material 114 and 118 are formed at the surface of the impurity-doped regions and gate electrodes 116 and 120 are formed overlying the gate insulating material. The layers of gate insulating material 114 and 118 can be layers of thermally grown silicon dioxide or, alternatively, a deposited insulator such as a silicon oxide, silicon nitride, a high dielectric constant ("high-k") insulator such as HfSiO, or the like. Deposited insulators can be deposited, for example, by chemical vapor deposition (CVD), low pressure chemical vapor deposition (LPCVD), or plasma enhanced chemical vapor deposition (PECVD).

Gate insulator layers 114 and 118 preferably have a thickness of about 1-10 nm, although the actual thickness can be determined based on the application of the transistor in the circuit being implemented. Gate electrodes 116 and 120 are preferably formed by depositing, patterning, and etching a layer of metal or polycrystalline silicon, preferably a layer of un-doped polycrystalline silicon. The gate electrodes generally have a thickness of about 100-300 nm. The polycrystalline silicon can be deposited, for example, by the reduction of silane in a CVD reaction. After formation of gate electrodes 116 and 120, the gate electrodes 116 and 120 can be used as etch masks during the etching of the layer of gate insulator material to form the gate insulators 114 and 118 underlying each gate electrode 116 and 120.

Figure 3:
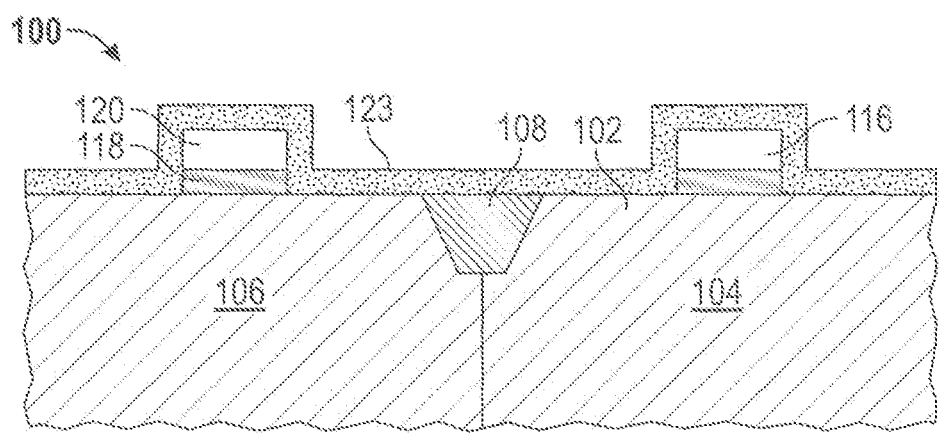

With reference now to FIG. 3, in one embodiment, a procedure for the contemporaneous formation of gate sidewall spacers and a silicide masking layer is illustrated. A layer of material 123 is conformally deposited over the surface of IC 100, including over both gate electrodes 116 and 120, to a uniform thickness sufficient to serve as a masking layer during a subsequent ion implantation step, as will be discussed in greater detail below. The layer of material 123 can include, for example, a silicon nitride material, which is a silicide-resistant material and is therefore useful as a silicide masking material. As discussed in greater detail below, gate sidewall spacers and a silicide masking layer can be formed from layer 123. As such, the presently disclosed process does not need separate, dedicated processes for the formation of sidewall spacers and for the formation of the silicide masking layer. Further, the presently disclosed process does not need a separate photo-lithographic patterning and etching process for the formation of the silicide masking layer. The elimination of these separate, dedicated processes reduces fabrication time, reduces costs, and improves the topography of the IC 100 by avoiding the etching associated with the silicide masking layer that has been shown to damage certain components of the IC 100.

Figure 4:
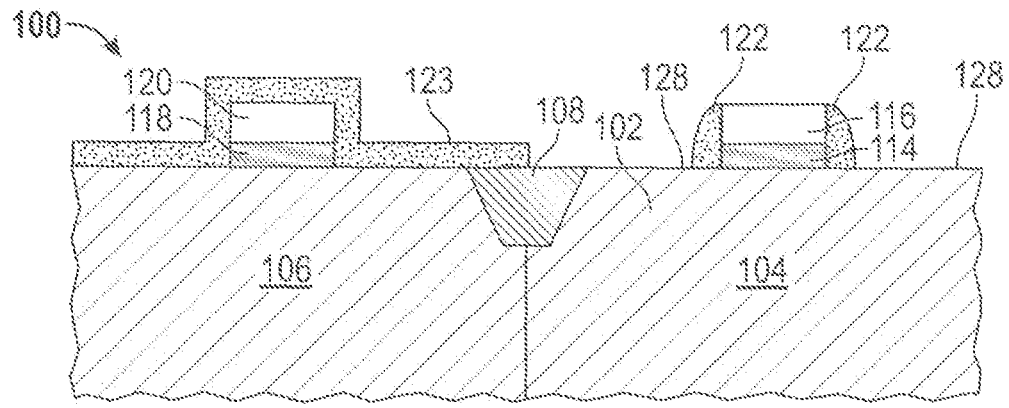

With reference now to FIG. 4, in one embodiment, a layer of masking material, which can be, for example, a layer of photoresist is applied and patterned over transistor 106. An etching technique, such as reactive ion etching (RIE), is employed to expose the transistor device 104 in the source/drain region 128. The masking material is patterned, for example, to leave the transistor device 106 masked while exposing the transistor device 104, as shown in FIG. 4 in the region 128. Sidewall spacers 122 are formed on the sidewalls of gate electrodes 116. Sidewall spacers are not formed at gate electrode 120, due to the masking material protecting the transistor 106 from the etching process. The material layer 123 remains fully covering the gate electrode 120. The sidewall spacers 122 are formed by anisotropically etching the layer 123, for example by RIE. In the example where layer 123 includes silicon nitride, silicon nitride can be etched, for example, in a $CHF_3$, $CF_4$, or $SF_6$ chemistry.

Figure 5:
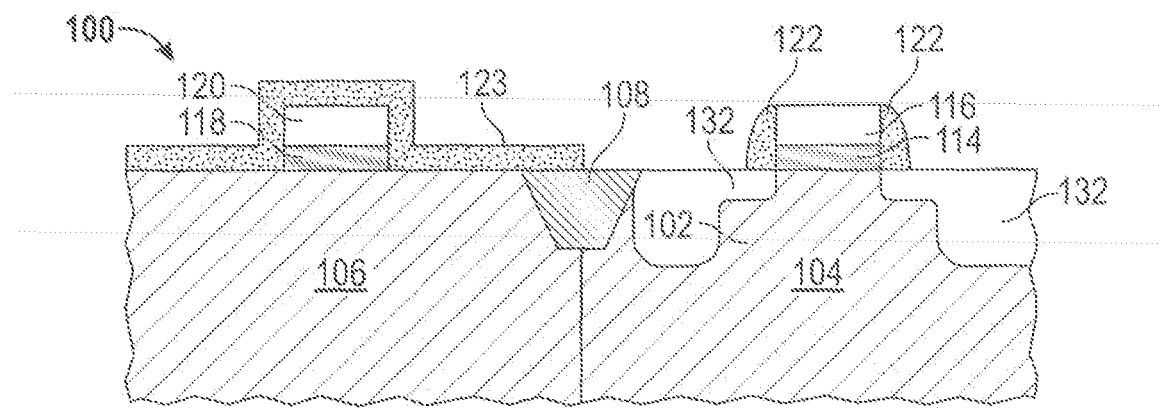

With reference now to FIG. 5, using the masking layer 123 as an ion implantation mask, conductivity determining ions are implanted into portions 132 of the silicon substrate to form a source and a drain region in the silicon substrate as is well-known in the art. The implanted ions can be either phosphorus, arsenic, or boron ions, or other conductivity determining ions. Portions 132 are formed in two separate steps, one each for the P-type and N-type doping ions. The ion-implanted source and drain regions are self-aligned with the gate electrodes. As those of skill in the art will appreciate, additional sidewall spacers and additional implantations may be employed to create drain extensions, halo implants, deep source and drains, and the like. It will also be appreciated by those skilled in the art that the order of forming the source and drain regions of the transistor device 104 can be reversed.

In accordance with an embodiment of the invention, a layer of a silicide-forming metal is deposited over the structure and in contact with the exposed portions of the source regions and drain regions 132. The silicide-forming metal can include, for example, nickel (Ni), dysprosium (Dy), erbium (Eb), holmium (Ho), lutetium (Lu), gadolinium (Gd), terbium (Tb), ytterbium (Yb), and yttrium (Y), among other metals as are known in the art. The silicide-forming metal is deposited to a thickness in the range of about 5 nm to about 40 nm. The silicide-forming metal can be deposited, for example, by plasma vapor deposition or by electrochemical deposition. An insulating film is then deposited overlying the silicide-forming metal. The insulating film can be formed of any insulating material, such as a dielectric material. In an exemplary embodiment, the insulating film is an oxide film deposited by CVD or PVD. The insulating film is deposited to a thickness that provides a uniform and continuous layer, without a significant presence of pinholes or other defects. In an exemplary embodiment, the insulating film is deposited to a thickness of about 1 to about 5 nm.

Figure 6:
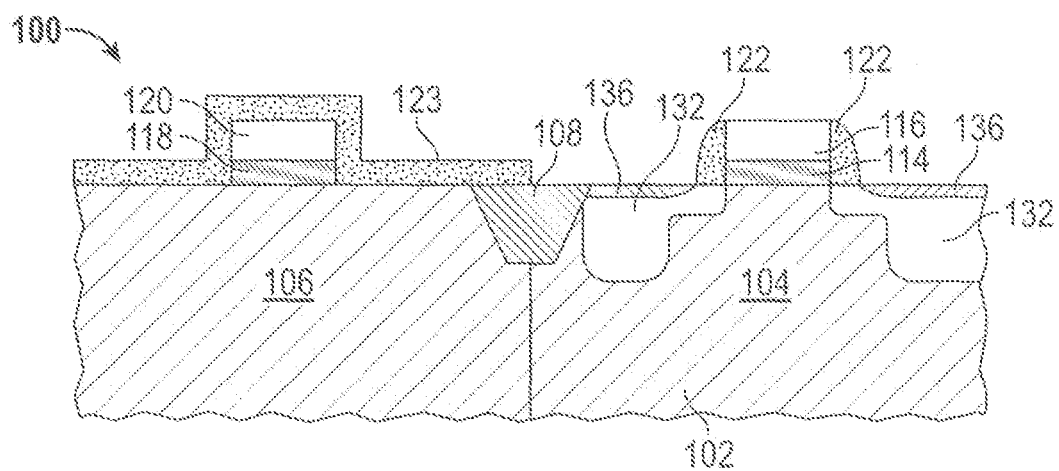

Referring now to FIG. 6, the method continues with the heating of the structure, for example by rapid thermal annealing (RTA), to cause the silicide-forming metals to react with the silicon to form a metal silicide 136 at the surface of the source and drain regions 132. For example, depending on the type of silicide-forming metal used, RTA can be performed at temperatures of about 400° C. to about 500° C. to ensure that the silicide-forming metal forms the silicide, as desired. Silicide forms only in those areas where there is exposed silicon in contact with the silicide-forming metals. Silicide does not form, and the silicide-forming metals remain unreacted in those areas where there is no exposed silicon such as on the sidewall spacers 122 and on the silicide masking layer 123. Thereafter, the insulating layer is removed using conventional etching techniques, and the unreacted silicide-forming metals can then be removed by wet etching in a $H_2O_2/H_2SO_4$, $HNO_3$/HCl, or aqua regia ($H_2O$, HCl, and $HNO_3$) solutions.

The silicide masking layer 123 is then removed from transistor 106 with the application of a patterned photo-resist and etching. By performing this single etching step of a masking layer over transistor 123, as opposed to separate masking and etching steps for the spacer formation, the source/drain implantation, and the silicide formation, numerous process steps are saved (thereby reducing manufacturing costs) and the potential for damage to transistor 106 is significantly reduced.

Thereafter, further processing steps can be performed to fabricate the IC 100, as are well-known in the art. For example, further steps (not shown) conventionally include, for example, capping the gate structures with a silicon nitride material, the formation of contacts to the silicide, and the formation of one or more patterned conductive layer across the device with dielectric layers thereinbetween, among many others. The subject matter disclosed herein is not intended to exclude any subsequent processing steps to form and test the completed IC 100 as are known in the art.

Accordingly, methods for forming a semiconductor device have been described. The methods include the contemporaneous formation of a silicide masking layer and gate electrode sidewall spacers to reduce the number of steps in the fabrication process, thereby reducing the costs of the fabrication process. Beneficially, by reducing the number of process steps as described above, the topography of the resulting IC is improved due to the elimination of one or more etching steps that has the potential to damage certain features of the IC.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a semiconductor device, the method comprising:

forming first and second electronic structures overlying a defined area of a semiconductor material substrate, the defined area of the semiconductor substrate being free of ion-implanted source or drain structures, wherein the first electronic structure is a gate of a transistor, and wherein the second electronic structure is a passive device;

depositing a layer of a silicide-resistant material over the first and second electronic structures and over the semiconductor substrate;

from the layer of silicide-resistant material, forming sidewall spacers adjacent the first electronic structure and removing the silicide-resistant material adjacent the sidewall spacers to expose the silicon substrate in a source and drain region of the first electronic structure while leaving the silicide-resistant material over the second electronic structure in-place;

after the steps of depositing the layer of the silicide-resistant material and forming sidewall spacers adjacent the first electronic structure, implanting conductivity determining ions in the source and drain region of the first electronic structure to form ion-implanted source and drain structures adjacent to the first electronic structure while the second electronic structure remains covered with the silicide-resistant material and while preventing source and drain structures from being formed adjacent to the second electronic structure, thereby leaving the second electronic structure free of ion-implanted source and drain structures adjacent thereto;

depositing a silicide forming metal over the source and drain region of the first electronic structure and in contact with the source and drain structures of the first electronic structure;

annealing the semiconductor device to form a silicide in the source and drain region of the first electronic structure; and removing an entirety of the layer of the silicide-resistant material from over the second electronic structure after the implanting of the conductivity determining ions and the annealing of the semiconductor device, wherein immediately subsequent to removing the layer of the silicide-resistant material, the second electronic structure remains free of ion-implanted source and drain structures adjacent thereto.

2. The method of claim 1, wherein depositing the layer of silicide-resistant material comprises depositing a layer of silicon nitride.

3. The method of claim 1, further comprising removing unreacted silicide-forming metal.

4. The method of claim 1, wherein annealing is performed using an RTA procedure.

5. The method of claim 1, wherein the silicide-resistant material formed over the second electronic structure comprises a silicide masking layer.

6. The method of claim 1, further comprising forming an insulating material layer over the silicide forming metal.

7. The method of claim 1, wherein depositing the layer of the silicide-resistant material comprises conformally depositing the layer to a uniform thickness.

8. The method of claim 1, further comprising forming contacts to the silicide.

9. The method of claim 1, wherein depositing the silicide-forming metal comprises depositing a metal comprising terbium (Tb).

10. The method of claim 1, wherein forming the sidewall spacers is performed using reactive ion etching techniques.

11. The method of claim 10, wherein removing the silicide-resistant material adjacent the sidewall spacers is performed using reactive ion etching techniques.

12. The method of claim 11, wherein removing the silicide-resistant material adjacent the sidewall spacers and forming the sidewall spacers is performed in a single step.

13. A method for fabricating a semiconductor device, the method comprising:
forming a plurality of electronic structures overlying a defined area of a semiconductor material substrate, the defined area of the semiconductor substrate being free of ion-implanted source or drain structures, the defined area defining an area for the formation of at least one electronic structure including silicides and at least one electronic structures not including silicides, wherein the first electronic structure is a gate of a transistor, and wherein the second electronic structure is a passive device;
conformally depositing a layer of silicon nitride over the plurality of electronic structures and over the semiconductor substrate;
etching the layer of silicon nitride using reactive ion etching techniques to form sidewall spacers adjacent a first electronic structure of the plurality of electronic structures and etching the layer of silicon nitride using reactive ion etching techniques adjacent the sidewall spacers and over a source/drain region of the first electronic structure of the plurality of electronic structures to expose the source/drain region of the first electronic structure while not etching any of the silicon nitride over a second electronic structure of the plurality of electronic structures, wherein both of said etching steps are performed simultaneously using anisotropic etching;
after the step of conformally depositing the layer of silicon nitride and after both of said etching steps, implanting conductivity determining ions in the source/drain region of the first electronic structure to form ion-implanted source/drain structures adjacent to the first electronic structure while the second electronic structure remains covered with the silicide-resistant material and while preventing source and drain structures from being formed adjacent to the second electronic structure, thereby leaving the second electronic structure free of ion-implanted source and drain structures adjacent thereto;
depositing a silicide forming metal over the exposed source/drain region of the first electronic structure;
annealing the semiconductor device using a rapid thermal annealing procedure to form a silicide in the source/drain region of the first electronic structure; and
removing an entirety of the layer of silicon nitride from over the second electronic structure of the plurality of electronic structures after the annealing of the semiconductor device, wherein immediately subsequent to removing the layer of silicon nitride, the second electronic structure remains free of ion-implanted source and drain structures adjacent thereto.

14. The method of claim 13, further comprising removing unreacted silicide-forming metal.

15. The method of claim 13, wherein the passive device is a resistor.

16. The method of claim 13, further comprising forming an insulating layer over the silicide-forming metal.

17. The method of claim 16, wherein forming an insulating material layer over the silicide forming metal comprises forming a dielectric material layer.

18. A method for fabricating a semiconductor device comprising:
forming first and second electronic structures in and over a defined region of a semiconductor substrate, the defined region being free of ion-implanted source or drain structures, wherein the first electronic structure is a gate of a transistor, and wherein the second electronic structure is a passive device;
forming a silicide-resistant material layer over an entirety of the defined region;
simultaneously (a) forming sidewall spacers from the silicide resistant material layer along the first electronic structure and (b) exposing source and drain regions of the semiconductor substrate adjacent to the first electronic structure;
subsequent to forming the silicide-resistant material layer and subsequent to the simultaneous steps of forming sidewall spacers and exposing source and drain regions, forming ion-implanted source and drain structures in the respective exposed source and drain regions of the semiconductor substrate adjacent to the first electronic structure
forming a silicide over the ion-implanted source and drain structures adjacent to the first electronic structure; and
subsequent to forming the silicide, removing an entirety of the silicide resistant material layer from over and along the second electronic structure.

19. The method of claim 18, wherein the step of simultaneously forming and exposing further comprises leaving silicide-resistant material formed over the second electronic structure in-place.

20. The method of claim 19, wherein the step of leaving silicide-resistant material formed over the second electronic structure in-place comprise depositing an etch mask over the second electronic structure prior to the step of simultaneously forming and exposing.

* * * * *